United States Patent
Suh

[11] Patent Number: 6,049,504
[45] Date of Patent: Apr. 11, 2000

[54] PULSE DRIVER

[75] Inventor: Jung Won Suh, Kyoungki-do, Rep. of Korea

[73] Assignee: Hyundai Electronics Industries Co., Ltd., Kyoungki-do, Rep. of Korea

[21] Appl. No.: 09/211,139

[22] Filed: Dec. 16, 1998

[30] Foreign Application Priority Data

Dec. 31, 1997 [KR] Rep. of Korea ................. 97-81296

[51] Int. Cl.[7] ............................................. G11C 8/00
[52] U.S. Cl. .................. 365/233; 365/194; 327/161; 327/164
[58] Field of Search ................... 365/233, 194; 327/161, 164, 172; 326/29

[56] References Cited

U.S. PATENT DOCUMENTS

| | | | |
|---|---|---|---|
| 4,701,884 | 10/1987 | Aoki et al. | 365/189 |
| 4,811,285 | 3/1989 | Walker et al. | 365/45 |
| 5,521,878 | 5/1996 | Ohtani et al. | 365/233 |
| 5,546,355 | 8/1996 | Raatz et al. | 365/233 |
| 5,546,569 | 8/1996 | Proebsting et al. | 395/550 |
| 5,664,538 | 9/1997 | Merritt | 365/194 |
| 5,940,336 | 8/1999 | Lee | 365/233 X |

*Primary Examiner*—Huan Hoang
*Attorney, Agent, or Firm*—Nath & Associates; Gary M. Nath; Gregory B. Kang

[57] ABSTRACT

An inventive pulse driver transmits a pulse signal in a high speed when the pulse signal is coupled thereto. For the purpose, the pulse driver comprises a first and a second CMOS inverters connected in series, a first inverting delay unit for delaying and phase-shifting an input signal coupled to the first CMOS inverter, a first regulating device, connected to an output terminal of the first CMOS inverter, for adjusting the output signal of the first CMOS inverter in response to an output signal of the first inverting delay unit, a second inverting delay unit for delaying and phase-shifting a signal which is outputted from the first CMOS inverter and inputted to the second CMOS inverter and a second regulating device, connected to the output terminal of the second CMOS inverter, for adjusting the output signal of the second CMOS inverter responsive to an output signal of the second inverting delay unit. Therefore, the pulse driver can drive a pulse signal in a high speed as twice as a conventional pulse driver. In addition, when the pulse driver is adopted to a clock driver, it can be advantageously applied to a delay lock loop (DLL) circuit since there is less change of delay.

15 Claims, 5 Drawing Sheets

PULSE DRIVER

FIELD OF THE INVENTION

The present invention relates to a synchronous dynamic random access memory (DRAM) device; and, more particularly, to a pulse driver capable of providing a pulse signal at a high speed to the synchronous DRAM device.

DESCRIPTION OF THE PRIOR ART

In general, a synchronous memory or a logic chip uses various pulse signals therein. A clock signal is a representative one among the pulse signals and has to drive a substantial amount of load since it is coupled to various circuits as an input signal.

In other words, a clock driver has to employ transistors of a large size in order to drive the substantial amount of load.

However, the clock driver using the transistors of the large size has a drawback that is delay of an input signal, due to an internal delay.

Referring to FIG. 1, there is shown a conventional pulse driver which comprises a plurality of CMOS inverters, e.g., 10 to 40, connected in series between an input terminal Vin and a load capacitor $C_L$.

Here, if a size of a PMOS transistor Mp1 of the CMOS inverter 10 is represented as Wp, a size of a PMOS transistor Mp2 of the CMOS inverter 20 becomes aWp; that of a PMOS transistor Mp3 of the CMOS inverter 30, $a^2$Wp; and that of a PMOS transistor Mp4 of the CMOS inverter 40, $a^3$Wp, wherein "a" is a positive integer larger than 1.

Likewise, if a size of an NMOS transistor Mn1 of the CMOS inverter 10 is referred to as Wn, a size of an NMOS transistor Mn2 of the CMOS inverter 20 becomes aWn; that of an NMOS transistor Mn3 of the CMOS inverter 30, $a^2$Wn; and that of an NMOS transistor Mn4 of the CMOS inverter 40, $a^3$Wn.

That is, in the pulse driver shown in FIG. 1, the sizes of the CMOS inverters 10 to 40 have to increase as their reference numerals increase from 10 to 40, thereby driving the load capacitor $C_L$.

However, in this pulse driver, gate capacitances of PMOS/NMOS transistors of a respective inverter act as load for its preceding inverter.

For instance, if the input signal Vin is changed from a logic low L to a logic high H, the NMOS transistor Mn1 of the CMOS inverter 10, the PMOS transistor Mp2 of the CMOS inverter 20, the NMOS transistor Mn3 of the CMOS inverter 30 and the PMOS transistor Mp4 of the CMOS inverter 40 are sequentially turned on. As a result, a signal of a logic high is supplied to the load capacitor $C_L$.

However, there is a limitation in a rapid transmission of the pulse signal since the gate capacitances of the remaining MOS transistors, i.e., Mp1, Mn2, Mp3 and Mn4, act as load during the pulse signal being transmitted.

SUMMARY OF THE INVENTION

It is, therefore, a primary object of the invention to provide a pulse driver capable of rapidly supplying a pulse signal therethrough when the pulse signal is coupled thereto.

It is, therefore, another object of the invention to provide a pulse driver which achieves a layout of a minimal size and can supply a pulse signal at a high speed.

In accordance with the present invention, there is provided a pulse driver for use in a synchronous DRAM circuit, which comprises: a transmission means being driven by an input signal; a delay means being driven by the input signal; and a switching means, connected to an output terminal of the transmission means, for providing a voltage to the output terminal in response to an output signal of the delay means, wherein a voltage level of the output terminal is determined by a pulse width of the output signal generated from the delay means.

In accordance with a first embodiment of the present invention, there is provided a pulse driver comprising: a first and a second CMOS inverters connected in series; a first inverting delay unit for delaying and phase-shifting an input signal coupled to the first CMOS inverter; a first regulating device, connected to an output terminal of the first CMOS inverter, for adjusting the output signal of the first CMOS inverter in response to an output signal of the first inverting delay unit; a second inverting delay unit for delaying and phase-shifting a signal which is outputted from the first CMOS inverter and inputted to the second CMOS inverter; and a second regulating device, connected to the output terminal of the second CMOS inverter, for adjusting the output signal of the second CMOS inverter responsive to an output signal of the second inverting delay unit.

In accordance with a second embodiment of the present invention, there is provided a pulse driver comprising: a first inverting delay unit for delaying and phase-shifting an input signal; a first regulating device for adjusting a voltage level of a first output signal in response to the input signal; a second regulating device, connected between a source voltage terminal and the first regulating device, for adjusting the voltage level of the first output signal in response to an output signal derived from the first inverting delay unit; a first latch unit for latching the voltage level of the first output signal; a second inverting delay unit for delaying and phase-shifting the first output signal coupled thereto; a third regulating device for adjusting a voltage level of a second output signal in response to the first output signal; a fourth regulating device, connected between a ground voltage terminal and the third regulating device, for adjusting the voltage level of the second output signal in response to an output signal generated from the second inverting delay unit; and a second latch unit for latching the voltage level of the second output signal.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Hereinafter, the preferred embodiments of the present invention will be illustrated in detail with reference to the accompanying drawings.

Figure 1:
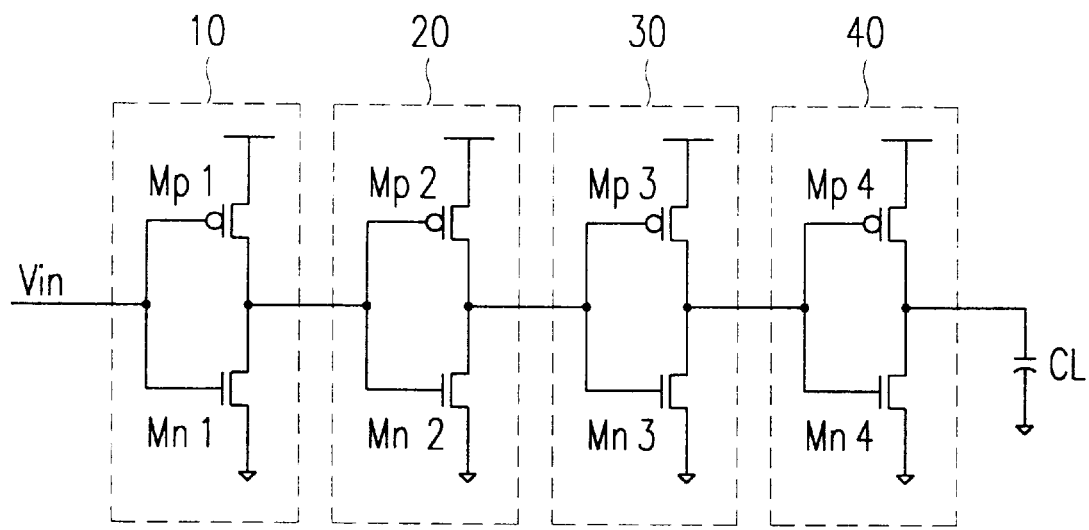
FIG. 1 shows a conventional pulse driver.
Figure 2:
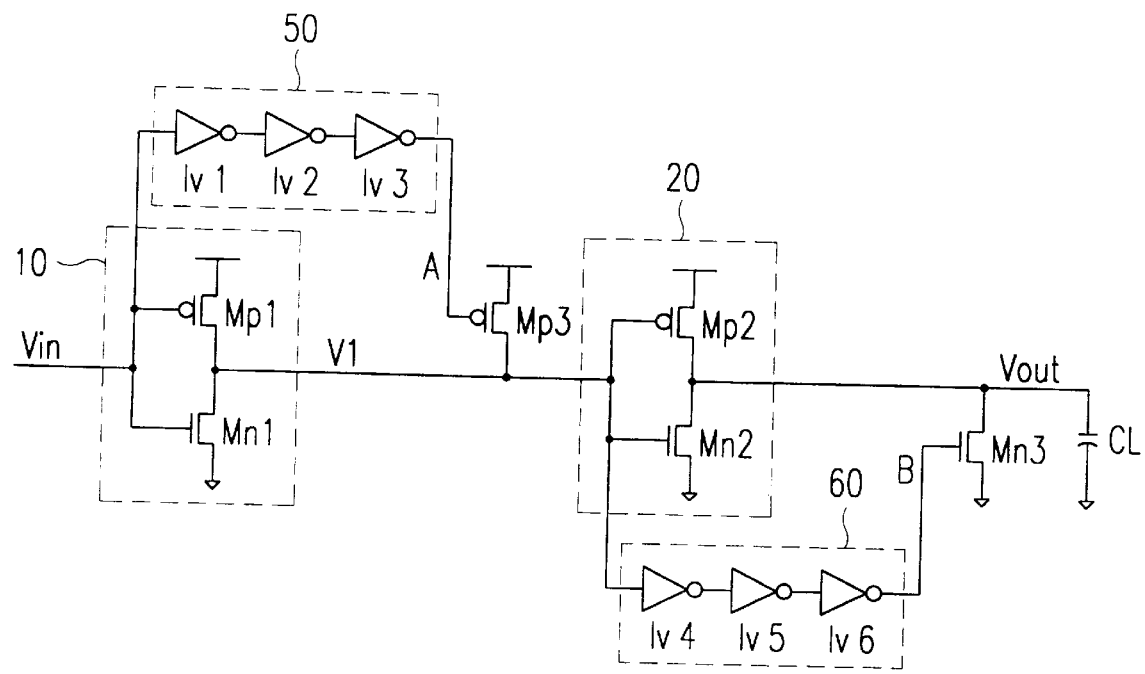
FIG. 2 illustrates a pulse driver in accordance with a first embodiment the present invention.

Referring to FIG. 2, there is provided a pulse driver in accordance with a first embodiment of the present invention.

In FIG. 2, a first and a second CMOS inverters 10 and 20 act as a transmission means and are connected in series between an input terminal Vin and an output terminal Vout. A first inverting delay unit 50 contains an odd number of inverters, e.g., IV1 to IV3, which are connected in series and attached to an input terminal of the first CMOS inverter 10. The first inverting delay unit 50 acts a delay means which delays the input signal Vin, coupled to the first CMOS inverter 10, by a pulse width thereof at the same time of phase-shifting.

A first regulating device employing a PMOS transistor Mp3 is disposed between a source voltage terminal and an output terminal V1 of the first CMOS inverter 10 and adjusts a voltage level of the output terminal V1 in response to an output signal of the first inverting delay unit 50.

A second inverting delay unit 60 contains an odd number of inverters, e.g., IV4 to IV6, connected in series at an input terminal of the second CMOS inverter 20. The second inverting delay unit 60 acts a delay means which delays the input signal V1, fed to the second inverting delay unit 60, by a pulse width thereof and shifts the phase of the input signal V1.

A second regulating device employing an NMOS transistor Mn3 is located between a ground voltage terminal and the output terminal Vout of the second CMOS inverter 20 and regulates a voltage level of the output terminal Vout under the control of an output signal of the second inverting delay unit 60.

In the above, the sizes of the NMOS transistor Mn1 of the first CMOS inverter 10, the first regulating device Mp3, the PMOS transistor Mp2 of the second CMOS inverter 20 and the second regulating device Mn3 are larger than those of the PMOS transistor Mp1 of the first CMOS inverter 10 and the NMOS transistor Mn2 of the second CMOS inverter 20.

Figure 3:
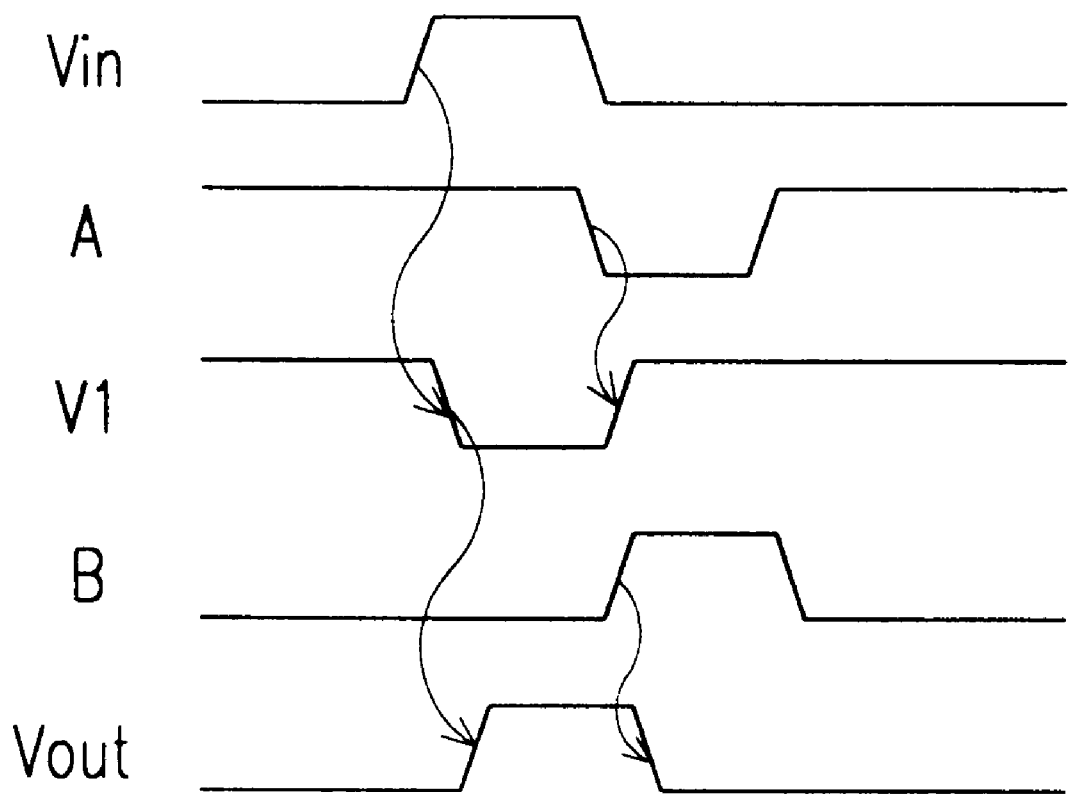
FIG. 3 provides an operational timing diagram of the pulse driver in FIG. 2.

In accordance with the first embodiment of the present invention, as shown in FIG. 3, when the input signal Vin is fed to the first CMOS inverter 10, the input signal Vin is also coupled to the first inverting delay unit So to be delayed as much as a predetermined time and then outputted as phase-shifted.

As described in FIG. 3, at first, if the input signal Vin is changed from a logic low to a logic high, at the moment, the output terminal V1 of the first CMOS inverter 10 is changed from a logic high to a logic low. After a predetermined time, the output signal A of the first inverting delay 50 is changed from a logic high to a logic low and coupled to a gate of the first regulating device Mp3. As a result, the first regulating device Mp3 is turned on and, thereafter, the output terminal V1 of the first CMOS inverter 10 is changed from a logic low to a logic high.

Through the above processes, the output signal V1 of the first CMOS inverter 10 is provided to the second CMOS inverter 20 and the second inverting delay unit 60 in parallel. At this time, if the output signal V1 of the first CMOS inverter 10 is changed from a logic high to a logic low, the output signal Vout of the second CMOS inverter 20 is changed from a logic low to a logic high. after a predetermined time at the second inverting delay unit 60, a phase-shifted signal B shown in FIG. 3 is changed from a logic low to a logic high. As a result, the second regulating device Mn3 is turned on and, consequently, the output signal Vout of the second CMOS inverter 10 is changed from a logic high to a logic low.

Accordingly, in accordance with the first embodiment of the present invention, since the gate capacitances of the PMOS transistor Mp1 and the first inverting delay unit 50 are relatively small so that there exists the load of the input signal Vin whose amount is identical to the gate capacitance of the NMOS transistor Mn1, the transmission of the pulse signal to the following device is fast. Further, since the gate capacitances of the NMOS transistor Mn2 and the second inverting delay unit 60 are small so that there exists the load of the input signal V1 whose amount is equal to the gate capacitance of the PMOS transistor Mp2, the fast transmission of the pulse signal is carried out.

Figure 4:
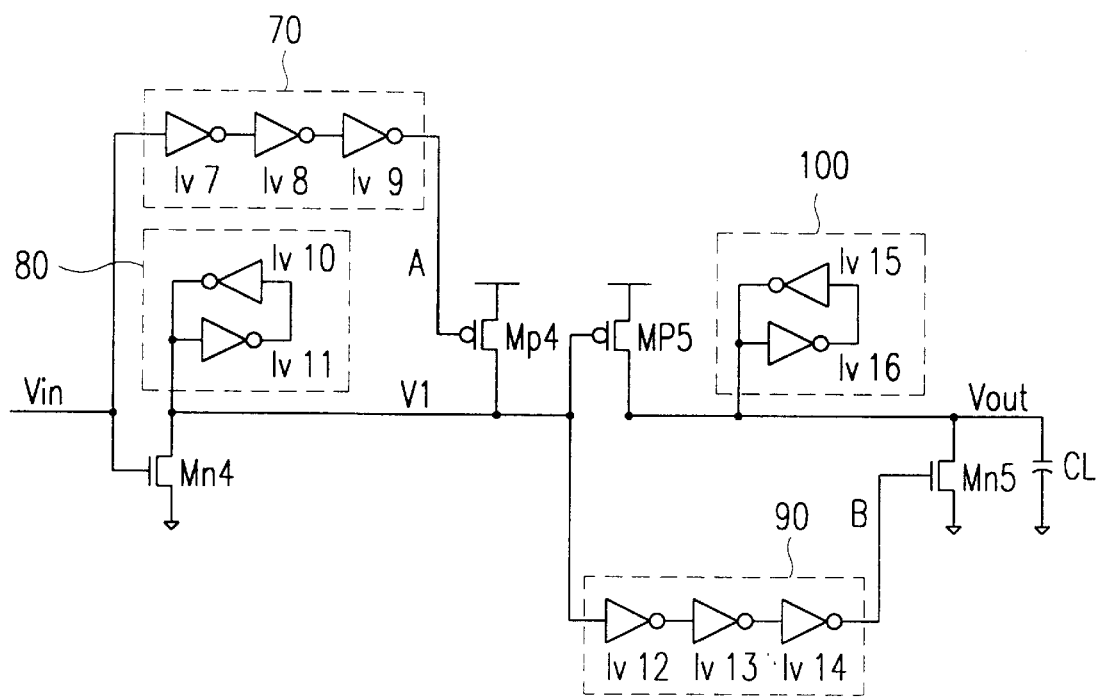
FIG. 4 describes a pulse driver in accordance with a second embodiment of the present invention.
Figure 5:
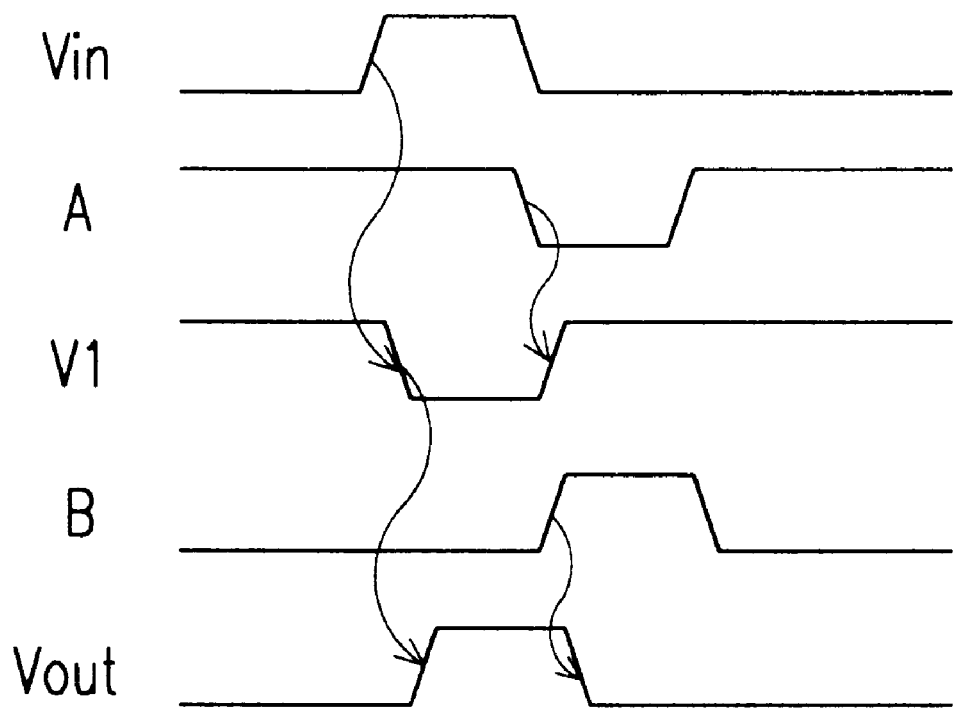
FIG. 5 represents an operational timing diagram of the pulse driver in FIG. 4.

Referring to FIG. 4, there is illustrated a pulse driver in accordance with a second embodiment of the present invention.

An input signal Vin is coupled to a first inverting delay unit 70 including an odd number of inverters, e.g., IV7, IV8 and IV9, connected in series which delays the input signal Vin by a pulse width thereof and outputs it as phase-shifted.

Also, the input signal Vin is provided to a gate of a first regulating device employing an NMOS transistor Mn4 which adjusts a voltage level of a first output terminal V1 under the control of the input signal Vin coupled thereto.

A second regulating device, employing a PMOS transistor Mp4, is located between a drain of an NMOS transistor Mn4, i.e., the control signal terminal V1, and a source voltage terminal and is turned on/off in response to a signal A derived from the first inverting delay unit 70 to thereby adjust a voltage level of the first output terminal V1.

The drain of the NMOS transistor Mn4, i.e., the first output terminal V1, is connected to a first latch unit 80 employing a multiplicity of inverters, e.g., IV10 and IV11, in order to latch the signal of the first output terminal V1.

The signal outputted through the first output terminal V1 is inputted to a second inverting delay unit 90 including an odd number of inverters, e.g., IV12, IV13 and IV14, and then delayed by a pulse width thereof at the same time of being phase-shifted by the second inverting delay unit 90.

Also, the signal of the first output terminal V1 is fed to a gate of a PMOS transistor Mp5 representing a third regulating device which adjusts a voltage level of a second output terminal Vout under the control of the signal V1 coupled thereto.

A fourth regulating device, employing an NMOS transistor Mn5, is positioned between the drain of the PMOS transistor Mp5, i.e., the second output terminal Vout, and a ground voltage terminal, the fourth regulating device is turned on/off in response to a signal B generated from the second inverting delay unit 90 to thereby adjust the voltage level of the second output signal terminal Vout.

The second output terminal Vout is connected to a second latch unit 100 employing a plurality of inverters, e.g., IV15 and IV16, in order to latch the signal of the second output terminal Vout.

In the above, since the sizes of the first regulating device Mn4, the second regulating device Mp4, the third regulating device Mp5 and the fourth regulating device Mn5 are larger than those of the first and the second latch units 80 and 100, their current drivabilities are greater than those of the first and the second latch units 80 and 100.

Therefore, in accordance with the second embodiment of the present invention, if the input signal Vin, inputted to the gate of the first regulating device Mn4, is changed from a logic low to a logic high, the first regulating device Mn4 is turned on and, accordingly, the voltage level of the first output terminal V1 is changed from a logic high to a logic low.

The input signal Vin, coupled to the first regulating device Mn4 and the first inverting delay unit 50 in parallel, is delayed by a predetermined time, phase-shifted, and then inputted to the gate of the second regulating device Mp4.

Accordingly, if the signal A fed to the gate of the second regulating device Mp4 is changed from a logic high to a logic low, the second regulating device Mp4 is turned on and, at the same time, the voltage level of the first output terminal V1 is altered from a logic low to a logic high.

The output signal on the first output terminal V1 generated as shown above is fed to the third regulating device Mp5 and the second inverting delay unit 90 in parallel. Therefore, if the control signal V1 is changed from a logic high to a logic low, the third regulating device Mp5 is turned on to thereby change the voltage level of the second output terminal Vout from a logic low to a logic high.

In course of the predetermined time, if the voltage level of the phase-shifted signal B derived from the second inverting delay unit 90 is altered from a logic low to a logic high, the fourth regulating device Mn5 is turned on and, as a result, the voltage level of the output terminal Vout is changed from a logic high to a logic low.

As illustrated above, in accordance with the second embodiment of the present invention, since the gate capacitances of the first latch unit 80 and the first inverting delay unit 70 are relatively small such that there exists the load of the input signal Vin whose amount is equal to the gate capacitance of the NMOS transistor Mn4, the transmission of the pulse signal to the following device is fast. Further, since the gate capacitances of the second latch unit 100 and the second inverting delay unit 90 are also small so that there exists the load of the input signal V1 whose amount is identical to the gate capacitance of the PMOS transistor Mp5, the transmission of the pulse signal is rapidly carried out.

As shown above, in accordance with the present invention, the inventive pulse driver can drive a pulse signal in a high speed as twice as the conventional pulse driver. In addition, when the pulse driver is adopted to a clock driver, it can be advantageously applied to a delay lock loop (DLL) circuit since there is less change of delay.

While the present invention has been described with respect to certain preferred embodiments only, other modifications and variations may be made without departing from the spirit and scope of the present invention as set forth in the following claims.

What is claimed is:

1. A pulse driver comprising:
   a first and a second CMOS inverters connected in series;
   a first inverting delay unit for delaying and phase-shifting an input signal coupled to the first CMOS inverter;
   a first regulating device, connected to an output terminal of the first CMOS inverter, for adjusting the output signal of the first CMOS inverter in response to an output signal of the first inverting delay unit;
   a second inverting delay unit for delaying and phase-shifting a signal which is outputted from the first CMOS inverter and inputted to the second CMOS inverter; and
   a second regulating device, connected to the output terminal of the second CMOS inverter, for adjusting the output signal of the second CMOS inverter responsive to an output signal of the second inverting delay unit.

2. The pulse driver of claim 1, wherein the first inverting delay unit includes an odd number of inverters connected in series.

3. The pulse driver of claim 1, wherein the second inverting delay unit includes an odder number of inverters connected in series.

4. The pulse driver of claim 1, wherein the first regulating device employs a PMOS transistor whose size is larger than that of a PMOS transistor of the first CMOS inverter.

5. The pulse driver of claim 1, wherein the second regulating device employs an NMOS transistor whose size is larger than that of an NMOS transistor of the second CMOS inverter.

6. A pulse driver comprising:
   a first inverting delay unit for delaying and phase-shifting an input signal;
   a first regulating device for adjusting a voltage level of a first output signal in response to the input signal;
   a second regulating device, connected between a source voltage terminal and the first regulating device, for adjusting the voltage level of the first output signal in response to an output signal derived from the first inverting delay unit;
   a first latch unit for latching the voltage level of the first output signal;
   a second inverting delay unit for delaying and phase-shifting the first output signal coupled thereto;
   a third regulating device for adjusting a voltage level of a second output signal in response to the first output signal;
   a fourth regulating device, connected between a ground voltage terminal and the third regulating device, for adjusting the voltage level of the second output signal in response to an output signal generated from the second inverting delay unit; and
   a second latch unit for latching the voltage level of the second output signal.

7. The pulse driver as recited in claim 6, wherein the first inverting delay unit includes an odd number of inverters connected in series.

8. The pulse driver as recited in claim 6, wherein the first regulating device employs a MOS transistor.

9. The pulse driver as recited in claim 6, wherein the second regulating device employs a MOS transistor.

10. The pulse driver as recited in claim 6, wherein the size of the first latch unit is smaller than those of the first and the second regulating devices.

11. The pulse driver as recited in claim 6, wherein the second inverting delay unit includes an odd number of inverters connected in series.

12. The pulse driver as recited in claim 6, wherein the third regulating device employs a MOS transistor.

13. The pulse driver as recited in claim 6, wherein the fourth regulating device employs a MOS transistor.

14. The pulse driver as recited in claim 6, wherein the size of the second latch unit is smaller than those of the third and the fourth regulating devices.

15. A pulse driver comprising:
   a first and second CMOS inverters connected in series;
   a first delay unit for delaying an input signal and coupled to the first CMOS inverter;
   a first regulating device connected to an output terminal of the first CMOS inverter, for adjusting the output signal of the first CMOS inverter in response to an output signal of the first delay unit;
   a second delay unit for delaying a signal which is outputted from the first CMOS inverter and inputted to the second CMOS inverter; and
   a second regulating device connected to the output terminal of the second CMOS inverter, for adjusting the output signal of the second CMOS inverter in response to an output signal of the second delay unit.

* * * * *